United States Patent
Notani

[19]
[11] Patent Number: 5,977,631
[45] Date of Patent: Nov. 2, 1999

[54] SEMICONDUCTOR DEVICE INCLUDING A SEMICONDUCTOR PACKAGE WITH ELECTROMAGNETIC COUPLING SLOTS

[75] Inventor: Yoshihiro Notani, Tokyo, Japan

[73] Assignee: Mitsubishi Denki Kabushiki Kaisha, Tokyo, Japan

[21] Appl. No.: 09/109,086

[22] Filed: Jul. 2, 1998

[30] Foreign Application Priority Data

Jun. 1, 1998 [JP] Japan ................................ 10-001082

[51] Int. Cl.⁶ .......................... H01L 23/12; H01L 23/14; H01L 23/48
[52] U.S. Cl. .......................... 257/728; 257/690; 257/712; 257/664; 257/680; 257/774; 257/713; 257/778; 257/704
[58] Field of Search ...................... 757/690, 728, 757/664, 778, 680, 700, 701, 734, 724, 758, 746, 767, 774, 712, 713, 777

[56] References Cited

U.S. PATENT DOCUMENTS

| | | | |
|---|---|---|---|
| 4,739,389 | 4/1988 | Goedbloed | 257/664 |
| 5,422,615 | 6/1995 | Shibagaki et al. | 257/728 |
| 5,438,305 | 8/1995 | Hikita et al. | 257/728 |
| 5,796,165 | 8/1998 | Yoshikawa et al. | 257/728 |
| 5,814,883 | 9/1998 | Sawai et al. | 257/704 |
| 5,852,391 | 12/1998 | Watanabe et al. | 252/728 |

FOREIGN PATENT DOCUMENTS 7176946  7/1995  Japan .

Primary Examiner—Alexander Oscar Williams
Attorney, Agent, or Firm—Leydig, Voit & Mayer, Ltd.

[57] ABSTRACT

A semiconductor device includes a high-frequency semiconductor chip having first and second surfaces, and including a first high-frequency transmission line on the first surface and a first grounding conductor on the second surface; and a semiconductor package having third and fourth surfaces, and including a second grounding conductor on the third surface and a second high-frequency transmission line on the fourth surface. The high-frequency semiconductor chip is mounted on the semiconductor package so that the second surface opposes the third surface. The semiconductor device further includes first and second slots for electromagnetically coupling the first high-frequency transmission line to the second high-frequency transmission line. The first and second slots on the first and second grounding conductors, respectively, oppose each other and oppose the first and second high-frequency transmission lines.

17 Claims, 15 Drawing Sheets

SEMICONDUCTOR DEVICE INCLUDING A SEMICONDUCTOR PACKAGE WITH ELECTROMAGNETIC COUPLING SLOTS

BACKGROUND OF THE INVENTION

1. Field of the Invention

The present invention relates to a semiconductor device including a semiconductor package with electromagnetic coupling slots, and in particular, to a semiconductor device comprising a high-frequency semiconductor chip mounted on an electromagnetic coupling type semiconductor package, for use at a frequency band equal to or higher than about 1 GHz, namely, a so-called microwave band, a quasi-millimeter wave band and a millimeter wave band. In the present specification, an electrical conductor is referred to as a conductor hereinafter.

2. Description of the Prior Art

FIG. 12 is a sectional view showing a structure of a prior art semiconductor device provided with an electromagnetic coupling type semiconductor package 101a and a high-frequency semiconductor chip 105, FIG. 13 is a plan view showing a top surface of the electromagnetic coupling type semiconductor package 101a of FIG. 12, and FIG. 14 is a bottom view showing a bottom surface of the electromagnetic coupling type semiconductor package 101a of FIG. 12. As shown in FIG. 12, the high-frequency semiconductor chip 105 is mounted on the electromagnetic coupling type semiconductor package 101a.

Referring to FIG. 13, microstrip conductors 102a and 102b are located in the vicinity of ends in the longitudinal direction of a ceramic layer 122 of the electromagnetic coupling type semiconductor package 101a. As shown in FIG. 12, respective microstrip lines L102a and L102b, which respectively serve as high-frequency signal inputting and outputting transmission lines, are constituted by the microstrip conductors 102a and 102b, with the ceramic layer 122 between them, and a grounding conductor 108. Further, as shown in FIG. 12, for the purpose of electromagnetically coupling microstrip lines L106a and L106b on the bottom surface of the electromagnetic coupling type semiconductor package 101a with the microstrip lines L102a and L102b, rectangular slots 103a and 103b, each located by removing a part of the grounding conductor 108, are located on the grounding conductor 108 which is an intermediate layer located between a ceramic layer 121 and the ceramic layer 122 perpendicular to and opposite the microstrip conductors 102a and 102b and microstrip conductors 106a and 106b of the microstrip lines L106a and L106b. In this case, as shown in FIG. 12, the microstrip lines L106a and L106b are constituted by the microstrip conductors 106a and 106b, the ceramic layer 121, and the grounding conductor 108.

Further, the microstrip conductor 102a is electrically connected to one terminal of the high-frequency semiconductor chip 105 by way of a bonding wire 110a, while the microstrip conductor 102b is electrically connected to the other terminal of the high-frequency semiconductor chip 105 by way of a bonding wire 110b. In this case, each of the bonding wires 110a and 10b is made of, for example, an Au wire having a diameter of about 25 μm. The reference numeral 104 denotes a bias conductor for supplying a DC bias voltage to the high-frequency semiconductor chip 105, while the reference numeral 111 denotes a through hole conductor for connecting the grounding conductor 108 to a grounding conductor 107 in the center of the bottom surface of the ceramic layer 121.

In general, the electromagnetic coupling type semiconductor package 110a is formed of a ceramic material such as alumina by a publicly known method including processes of thick film formation, lamination and simultaneous firing. The high-frequency semiconductor chip 105 is die-bonded to the electromagnetic coupling type semiconductor package 101a with a solder material such as AuSn solder, an electrically conductive bonding material or the like.

In the prior art semiconductor device constructed as above, the microstrip line L106a is electromagnetically connected to the microstrip line L102a via the rectangular slot 103a, while the microstrip line L102a is electrically connected to the high-frequency semiconductor chip 105 via the bonding wire 110a. On the other hand, the microstrip line L106b is electromagnetically connected to the microstrip line L102b via the rectangular slot 103b, while the microstrip line L102b is electrically connected to the high-frequency semiconductor chip 105 via the bonding wire 110b. Therefore, for example, a high-frequency signal inputted to the microstrip line L106a is inputted to the high-frequency semiconductor chip 105 via the rectangular slot 103a, the microstrip line L102a and the bonding wire 110a. Then, the inputted high-frequency signal is subjected to the processes of amplification and so on, and the high-frequency signal outputted subsequently is outputted from the high-frequency semiconductor chip 105 to the microstrip line L106b via the bonding wire 110b, the microstrip line L102b and the rectangular slot 103b.

FIG. 15 is a graph showing a high-frequency transmission characteristic of the semiconductor device shown in FIGS. 12 to 14. As is apparent from FIG. 15, the semiconductor device has a transmission loss equal to or smaller than 3 dB in a band ranging from 40 GHz to 60 GHz, and the semiconductor device can be used in this band. In the high-frequency transmission band of the semiconductor device, a desired band can be obtained by adjusting the widths and lengths of the rectangular slots 103a and 103b, the length of each stub or the like.

In the case of this prior art semiconductor device employing the electromagnetic coupling type semiconductor package 110a, the high-frequency semiconductor chip 1 and the semiconductor package 101a are connected to each other by way of the bonding wires 110a and 10b. Therefore, inductance components of the bonding wires 110a and 10b operate as resistance components respectively in the high-frequency region of the quasimillimeter wave band and the millimeter wave band, and this leads to increase in the loss of the high-frequency transmission signal. Furthermore, the bonding wires 110a and 110b cannot control the line impedance as a high-frequency signal transmission line, and therefore, there is such a problem that a reflection loss due to an impedance mismatching with the high-frequency transmission line increases between the high-frequency semiconductor chip 1 and the semiconductor package 101a. Furthermore, the electromagnetic coupling portions of the rectangular slots 103a and 103b allow signals to pass through them only in a desired frequency band, and a total reflection occurs in the other frequency bands on the output side of the high-frequency semiconductor chip 1, resulting in the feedback of the signals to side of the high-frequency semiconductor chip 1. Therefore, there is such a problem that a parasitic oscillation is caused.

SUMMARY OF THE INVENTION

An essential object of the present invention is to provide a semiconductor device capable of preventing the increase in reflection loss due to the impedance mismatching.

Another object of the present invention is to provide a semiconductor device capable of preventing the occurrence of the above-mentioned parasitic oscillation.

In order to achieve the above-mentioned objective, according to one aspect of the present invention, there is provided a semiconductor device comprising:

a high-frequency semiconductor chip having first and second surfaces, and including a first high-frequency inputting and outputting transmission line formed on said first surface and a first grounding conductor formed on said second surface; and a semiconductor package having third and fourth surfaces, and including a second grounding conductor formed on said third surface and a second high-frequency inputting and outputting transmission line formed on said fourth surface, wherein said high-frequency semiconductor chip is mounted on said semiconductor package so that said second surface opposes to said third surface; and wherein said semiconductor device further comprises first and second slots for electromagnetically coupling said first high-frequency inputting and outputting transmission line with said second high-frequency inputting and outputting transmission line, said first and second slots being formed on said first and second grounding conductors, respectively, so as to oppose to each other and to oppose to said first and second high-frequency inputting and outputting transmission lines.

The above-mentioned semiconductor device preferably further comprises an Ni conductor formed on said first grounding conductor located in a peripheral portion of said first slot.

The above-mentioned semiconductor device preferably further comprises an Ni conductor formed on said second grounding conductor located in a peripheral portion of said second slot.

The above-mentioned semiconductor device preferably further comprises a filter circuit for removing frequency components other than a frequency component transmitting via said high-frequency semiconductor chip, said filter circuit being connected to said first high-frequency inputting and outputting transmission line.

The above-mentioned semiconductor device preferably further comprises a further filter circuit for removing frequency components other than a frequency component transmitting via said high-frequency semiconductor chip, said further filter circuit being connected to said second high-frequency inputting and outputting transmission line.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the attached drawings.

FIRST PREFERRED EMBODIMENT

Figure 1:
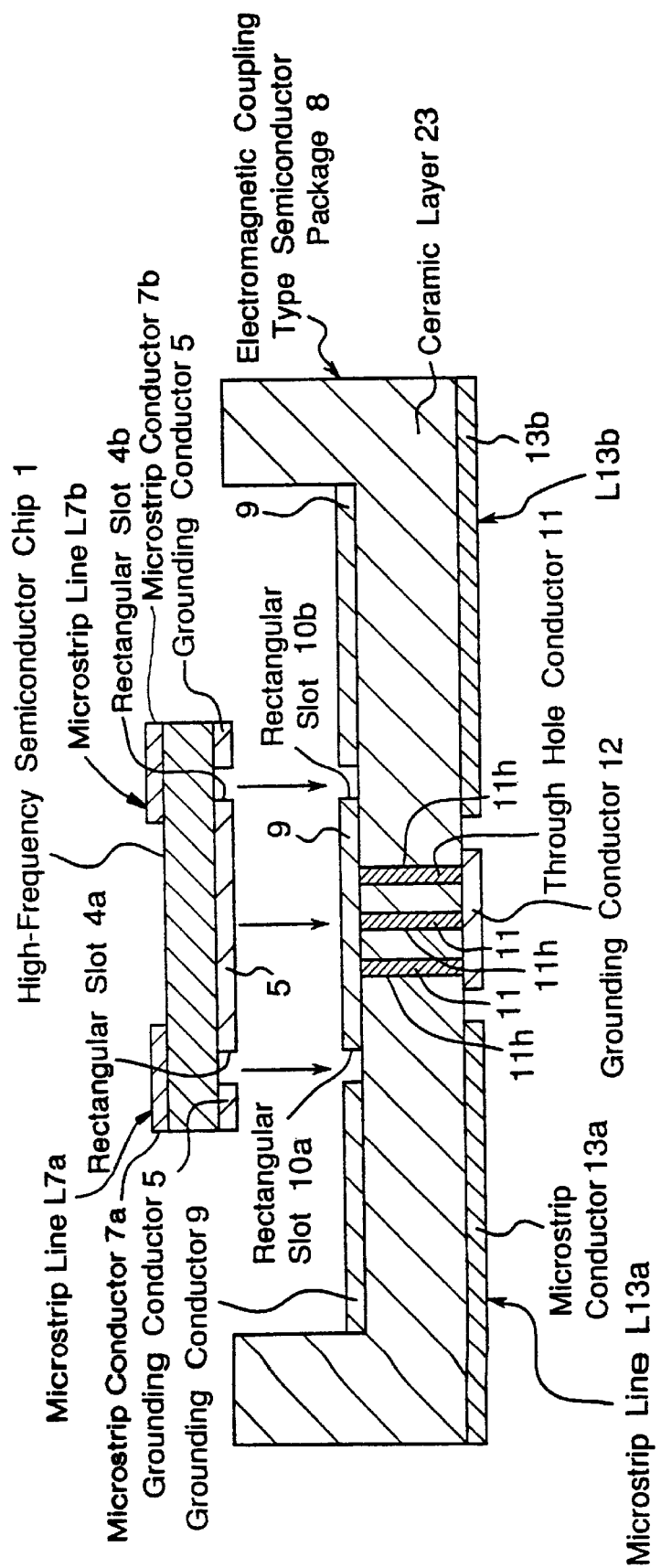
FIG. 1 is a sectional view showing a structure of a semiconductor device provided with a high-frequency semiconductor chip and an electromagnetic coupling type semiconductor package according to a first preferred embodiment of the present invention.
Figure 2:
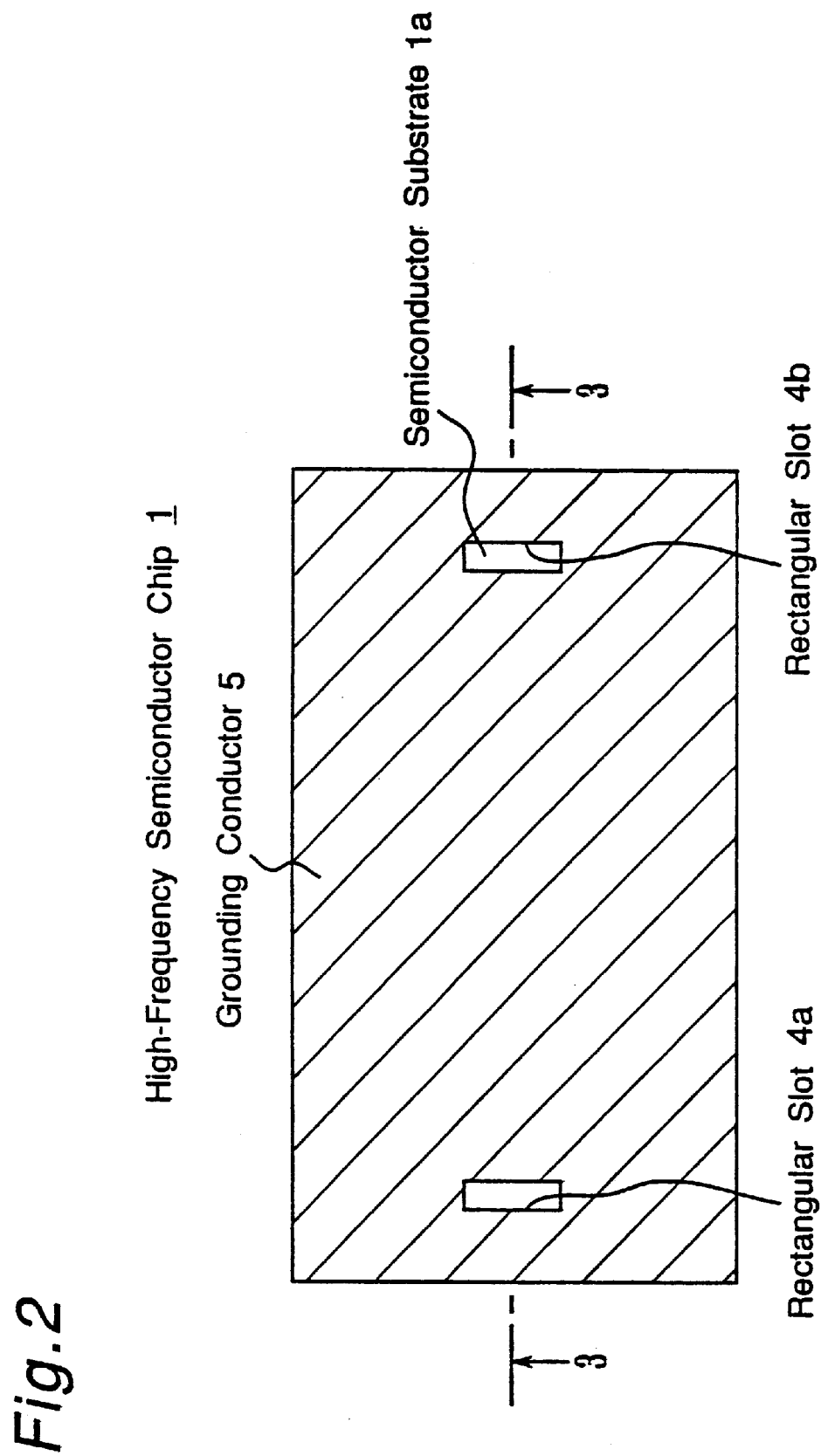
FIG. 2 is a bottom view showing a bottom surface of the high-frequency semiconductor chip shown in FIG. 1.
Figure 3:
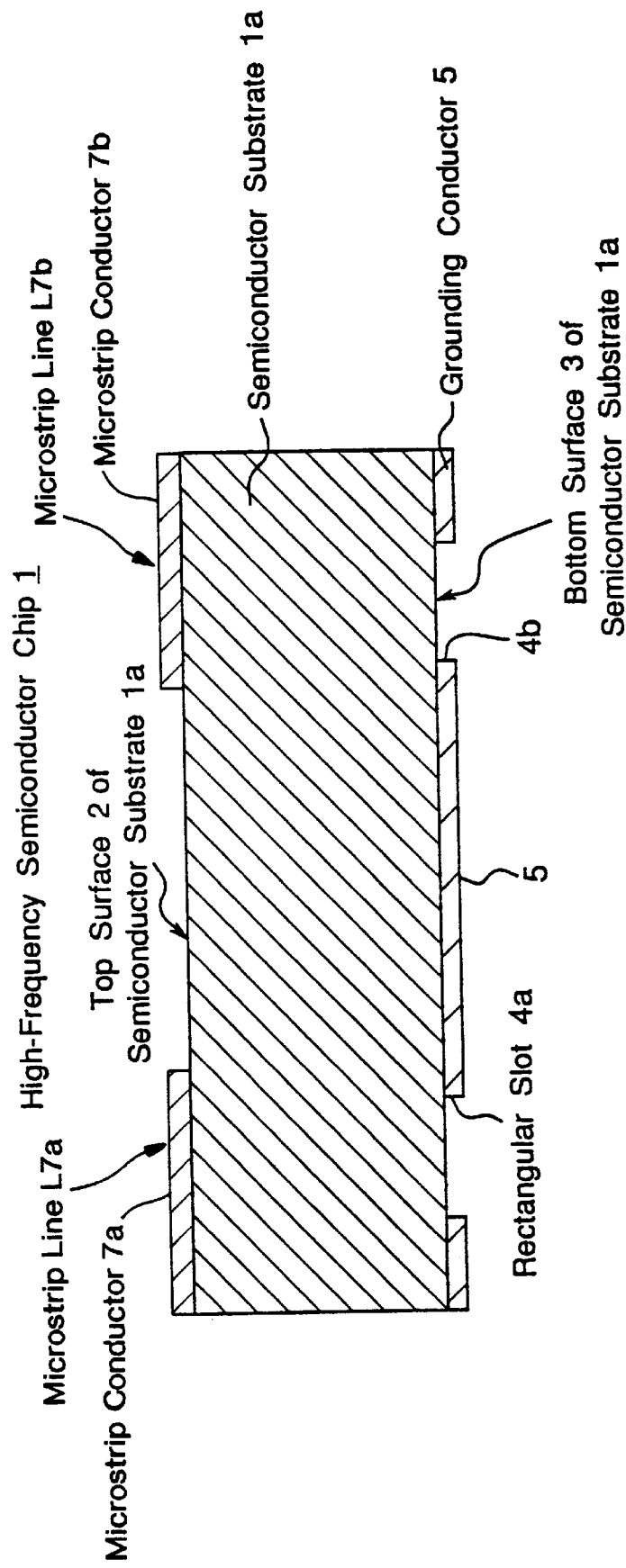
FIG. 3 is a sectional view of the high-frequency semiconductor chip taken along a line 3—3 of FIG. 2.

FIG. 1 is a sectional view showing a structure of a semiconductor device provided with a high-frequency semiconductor chip 1 and an electromagnetic coupling type semiconductor package 8 according to a first preferred embodiment of the present invention, and FIG. 2 is a bottom view showing a bottom surface of the high-frequency semiconductor chip 1 shown in FIG. 1. FIG. 3 is a sectional view of the high-frequency semiconductor chip 1 taken along a line 3—3 of FIG. 2, and FIG. 4 is a plan view showing a top surface of the high-frequency semiconductor chip 1 shown in FIG. 1.

Referring to FIG. 1, the semiconductor device of the present preferred embodiment has a structure, in which the high-frequency semiconductor chip 1 is mounted on the electromagnetic coupling type semiconductor package 8 provided with one ceramic layer 23, and rectangular slots 4a and 10a opposing each other and rectangular slots 4b and 10b opposing each other. The slots electromagnetically connect microstrip lines L13a and L13b on the bottom surface of the electromagnetic coupling type semiconductor package 8 respectively with microstrip lines L7a and L7b on the top surface of the high-frequency semiconductor chip 1. In this case, each of the rectangular slots 4a and 4b is by removing a part of a grounding conductor 9 formed on the top surface of the electromagnetic coupling type semiconductor package 8, while each of the rectangular slots 10*a* and 10*b* is formed by removing a part of a grounding conductor 5 on the top surface of the electromagnetic coupling type semiconductor package 8. Further, a plurality of through hole conductors 11 are formed by filling a plurality of through holes 11*h*, which penetrate the ceramic layer 23, with a metal material for electrically connecting the grounding conductor 9 to a grounding conductor 12.

Referring to FIGS. 2 and 3, the grounding conductor 5 is formed by Au plating the entire surface of the bottom surface 3 of a semiconductor substrate 1*a* of the high-frequency semiconductor chip 1 for soldering and forming a ground potential on the semiconductor package 8. Thereafter, each of the rectangular slots 4*a* and 4*b* is formed by removing a part of the grounding conductor 5 in the vicinity of the ends, in the longitudinal direction, of the high-frequency semiconductor chip 1. It is to be noted that the formation of the grounding conductor 5 having the rectangular slots 4*a* and 4*b* may be performed through a single process which does not form Au or the like in the portions of the rectangular slots 4*a* and 4*b* by, for example, a publicly known photographic patterning technique.

Figure 4:
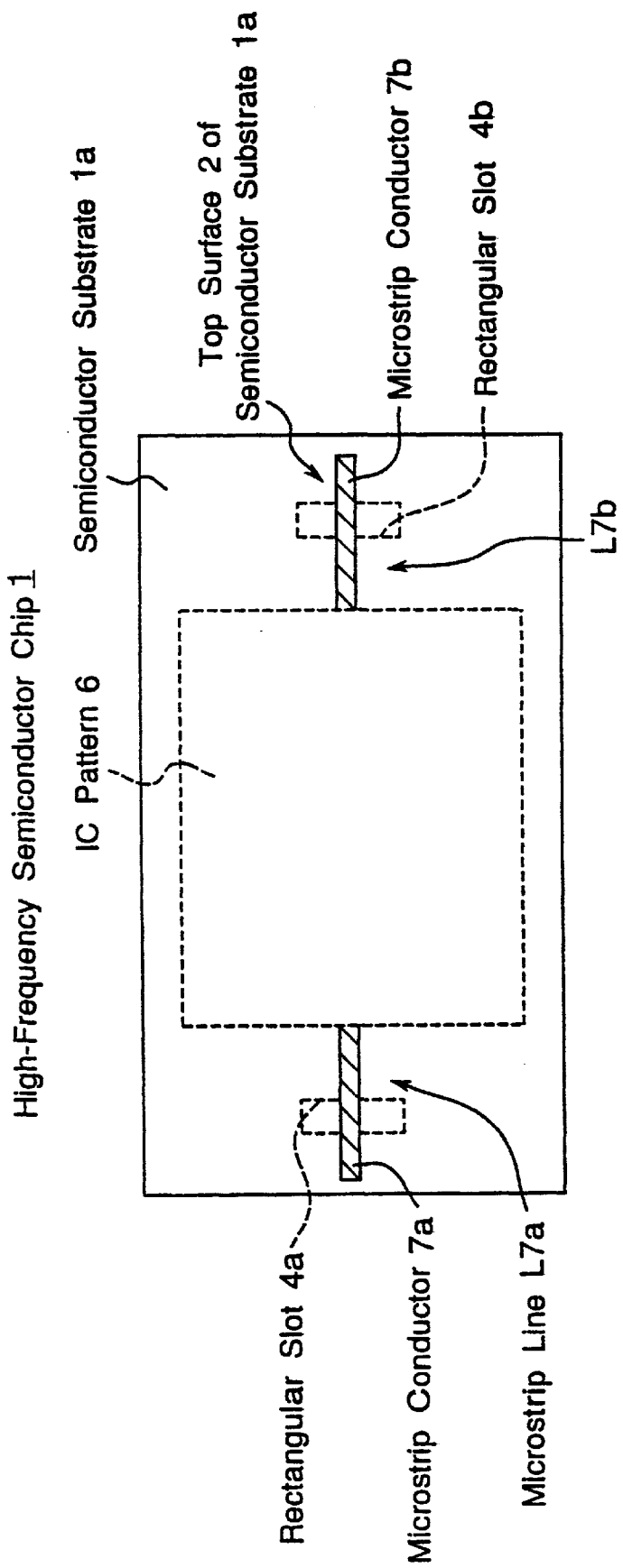
FIG. 4 is a plan view showing a top surface of the high-frequency semiconductor chip shown in FIG. 1.

On the other hand, as shown in FIG. 4, an IC pattern 6 is formed in the center portion of the top surface 2 of the semiconductor substrate 1a of the high-frequency semiconductor chip 1, and microstrip conductors 7*a* and 7*b* are located in the vicinity of the ends, in the longitudinal direction, of the semiconductor substrate 1*a* in such a manner that the microstrip conductors 7*a* and 7*b* are perpendicular to the rectangular slots 4*a* and 4*b* and electrically connected to the terminals of the IC pattern 6.

Figure 5:
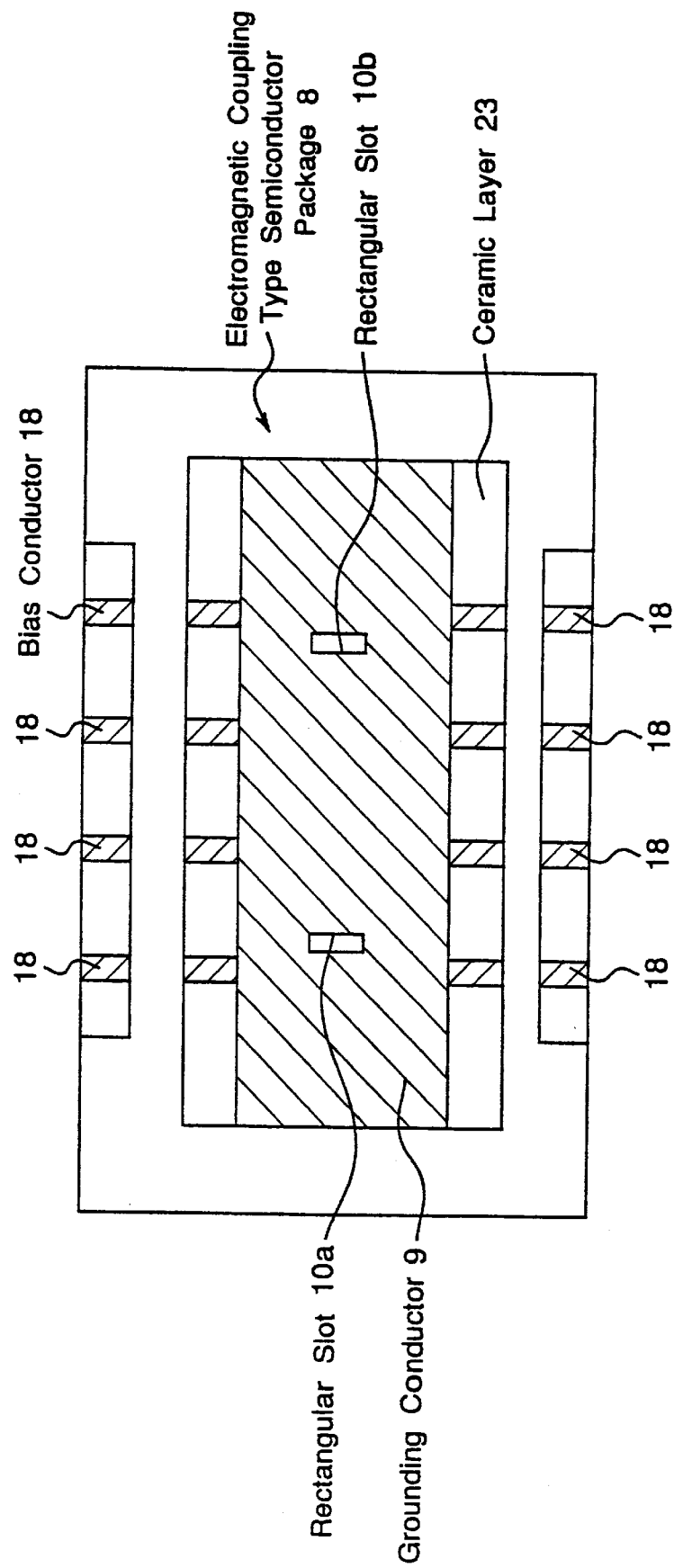
FIG. 5 is a plan view showing a top surface of the electromagnetic coupling type semiconductor package shown in FIG. 1.

FIG. 5 is a plan view showing a top surface of the electromagnetic coupling type semiconductor package 8 shown in FIG. 1.

Referring to FIG. 5, the ceramic layer 23 of the electromagnetic coupling type semiconductor package 8 is formed of a ceramic material such as alumina or the like by a publicly known method including the processes of thick film formation and firing. The grounding conductor 9 for bonding the high-frequency semiconductor chip 1 using solder is formed around in the center portion of the top surface of the ceramic layer 23; Thereafter, each of the rectangular slots 10*a* and 10*b* is formed by removing a part of the grounding conductor 9 in such a manner that the rectangular slots 10*a* and 10*b* oppose the rectangular slots 4*a* and 4*b*, respectively, when the high-frequency semiconductor chip 1 is mounted on the electromagnetic coupling type semiconductor package 8, so that the surface of the grounding conductor 5 opposes and is in contact with the surface of the grounding conductor 9. It is to be noted that the formation of the grounding conductor 9 having the rectangular slots 10*a* and 10*b* may be performed through a single process which does not form Au or the like in the portions of the rectangular slots 10*a* and 10*b* by, for example, a publicly known photographic patterning technique. The reference numeral 18 denotes a bias conductor for supplying a DC bias voltage to the high-frequency semiconductor chip 1, this bias conductor 18 serving as a field through type line.

Figure 6:
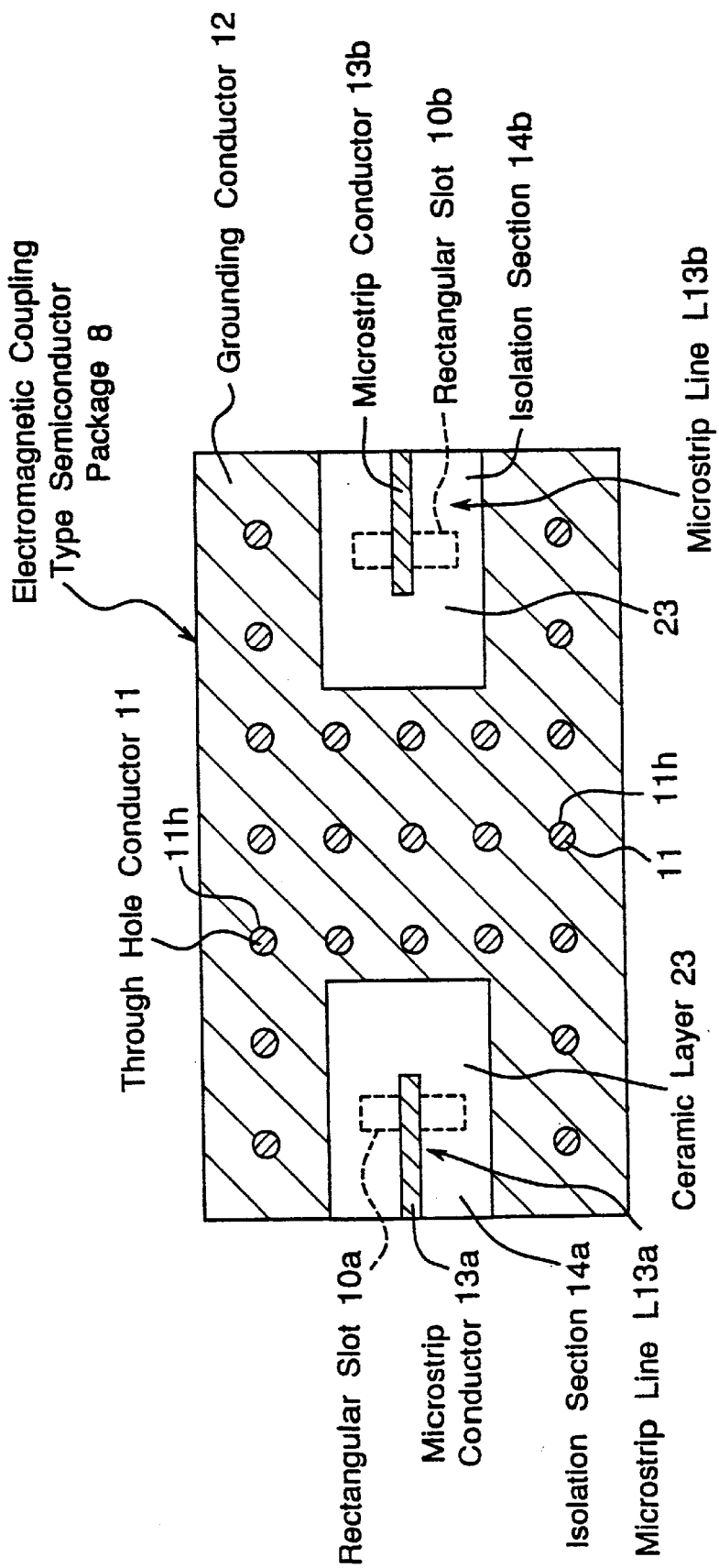
FIG. 6 is a bottom view showing a bottom surface of the electromagnetic coupling type semiconductor package 8 shown in FIG. 1.

FIG. 6 is a bottom view showing a bottom surface of the electromagnetic coupling type semiconductor package 8 shown in FIG. 1.

Referring to FIG. 6, the grounding conductor 12 is formed on the entire surface of the bottom surface of the ceramic layer 23, and thereafter, each of isolation sections 14*a* and 14*b* is formed by removing a part of the grounding conductor 12 in the vicinity of both ends in the longitudinal direction of the ceramic layer 23. In this case, the substantially or approximately center portions of the isolation sections 14*a* and 14*b* oppose to the rectangular slots 10*a* and 10*b*, respectively. It is to be noted that the formation of the grounding conductor 12 having the rectangular slots 14*a* and 14*b* may be performed through one process which does not form a conductor only in the isolation sections 14*a* and 14*b* by, for example, a publicly known photographic patterning technique. Then, microstrip conductors 13*a* and 13*b* are formed in the end portions of the isolation sections 14*a* and 14*b* so as to become perpendicular to the rectangular slots 10*a* and 10*b*.

As is apparent from FIG. 1, the microstrip line L13*a* is constituted by the microstrip conductor 13*a* and the grounding conductor 9, which interpose therebetween the ceramic layer 23 of the electromagnetic coupling type semiconductor package 8, while the microstrip line L13*b* is constituted by the microstrip conductor 13*b* and the grounding conductor 9 which interpose the ceramic layer 23 therebetween. On the other hand, the microstrip line L7*a* is constituted by the microstrip conductor 7*a* and the grounding conductor 5 which interpose therebetween the semiconductor substrate 1*a* of the high-frequency semiconductor chip 1, while the microstrip line L7*b* is constituted by the microstrip conductor 7*b* and the grounding conductor 5 which interpose the semiconductor substrate 1*a* therebetween. These microstrip lines L13*a*, L13*b*, L7*a* and L7*b* are high-frequency transmission lines for transmitting high-frequency signals inputted to or outputted from the circuit of the IC pattern 6 of the high-frequency semiconductor chip 1.

In the present preferred embodiment, the rectangular slots 4*a*, 10*a*, 4*b* and 10*b* preferably have rectangular shapes identical in size to one another, and the rectangular slots 4*a* and 10*a* are formed in such a manner that the rectangular slot 4*a* substantially completely opposes the rectangular slot 10*a* when the high-frequency semiconductor chip 1 is mounted on the electromagnetic coupling type semiconductor package 8, i.e., in such a manner that the rectangular slots 4*a* and 10*a* become parallel to each other in the longitudinal direction and aligned in position. On the other hand, the rectangular slots 4*b* and 10*b* are formed in such a manner that the rectangular slot 4*b* substantially completely opposes to the rectangular slot 10*b*, i.e., in such a manner that the rectangular slots 4*b* and 10*b* become parallel to each other in the longitudinal direction and aligned in position. In this case, the sizes of the rectangular slots 4*a*, 10*a*, 4*b* and 10*b* are set by a publicly known method so that the microstrip line L13*a* matches in impedance with the microstrip line L7*a* and the microstrip line L13*b* matches in impedance with the microstrip line L7*b*.

A method for mounting the high-frequency semiconductor chip 1 onto the electromagnetic coupling type semiconductor package 8 will be described next with reference to FIG. 1.

Referring to FIG. 1, the rectangular slot 4*a* and the rectangular slot 10*a* are positioned so as to oppose to each other, and the rectangular slot 4*b* and the rectangular slot 10*b* are positioned so as to oppose to each other. Thereafter, the high-frequency semiconductor chip 1 is die-bonded onto the grounding conductor 9 of the electromagnetic coupling type semiconductor package 8 using a solder made of AuSn or the like while scrubbing the high-frequency semiconductor chip 1 on the electromagnetic coupling type semiconductor package 8 (this process will be referred to as a scrubbing process hereinafter) in the longitudinal direction of the electromagnetic coupling type semiconductor package 8 and a direction perpendicular to it for the purpose of making the AuSn solder become familiar with the grounding conductor. A positioning accuracy of the die bonding in this stage is ±30 µm to ±50 µm when an automatic die bonder sold on the market is used, or about ±10 µm when a flip chip bonder sold on the market is used, allowing the die-bonding positional alignment to be performed without problems.

Then, in the semiconductor device obtained after mounting the high-frequency semiconductor chip 1 on the electromagnetic coupling type semiconductor package 8, the microstrip conductor 13a opposes to the microstrip conductor 7a via the rectangular slots 10a and 4a, and therefore, the microstrip line L13a is electromagnetically connected to the microstrip line L7a via the rectangular slots 10a and 4a. On the other hand, the microstrip conductor 13b opposes to the microstrip conductor 7b via the rectangular slots 10b and 4b, and therefore, the microstrip line L13b is electromagnetically connected to the microstrip line L7b via the rectangular slots 10b and 4b. Therefore, for example, a high-frequency signal inputted to the microstrip line L13a is inputted to the IC pattern 6 of the high-frequency semiconductor chip 1 via the rectangular slots 10a and 4a and the microstrip line L7a. Then, the inputted high-frequency signal is subjected to the processes of amplification and so on, and thereafter, the outputted high-frequency signal is outputted from the IC pattern 6 to the microstrip line L13b via the microstrip line L7b as well as the rectangular slots 4b and 10b.

Figure 12:
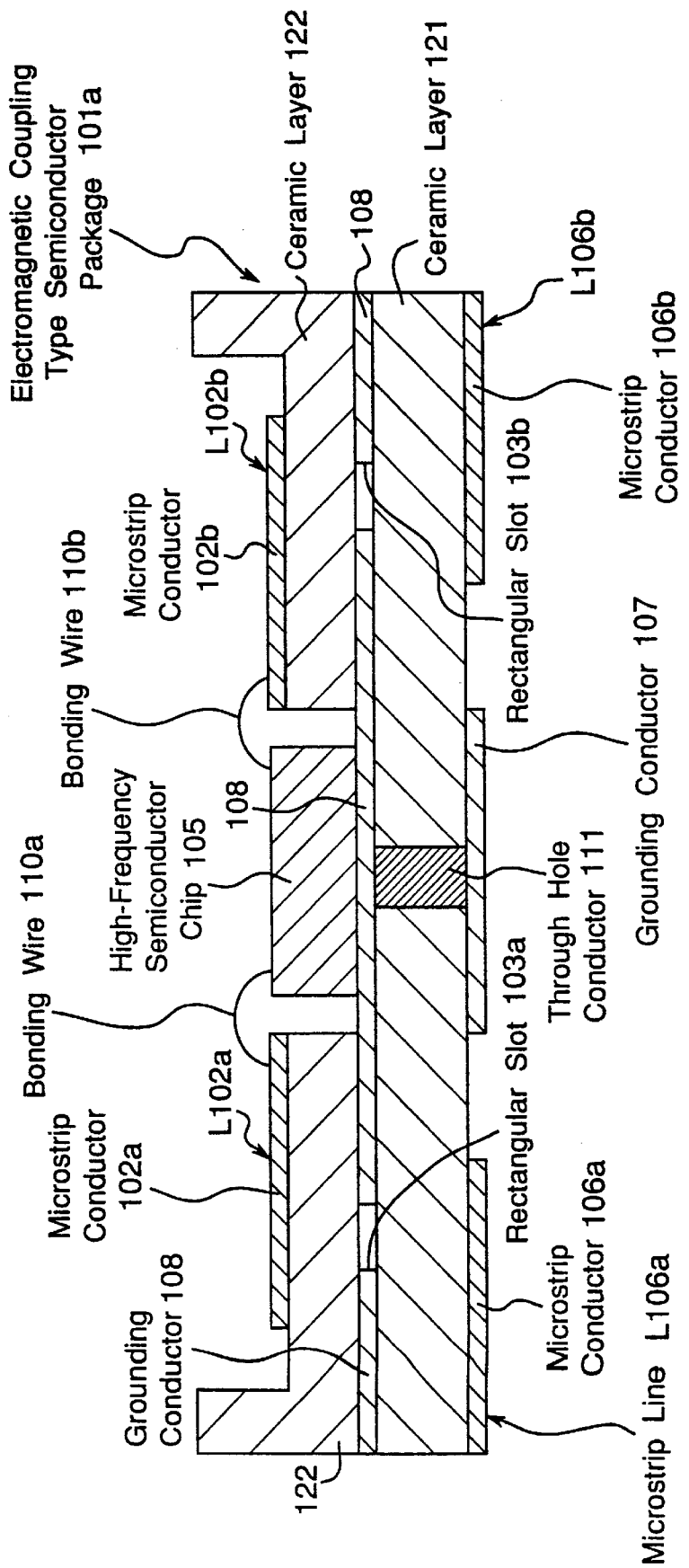
FIG. 12 is a sectional view showing a structure of a prior art semiconductor device provided with an electromagnetic coupling type semiconductor package 101a and a high-frequency semiconductor chip.

In the prior art, as shown in FIG. 12, the electrical connection of the high-frequency signal between the high-frequency semiconductor chip 1 and the electromagnetic coupling type semiconductor package 8 has been performed by the wire bonding of 110a and 10b. In contrast to this, by using the method disclosed in the present first preferred embodiment, for example, the high-frequency signal is transmitted from the microstrip line L13a of the electromagnetic coupling type semiconductor package 8 to the microstrip line L7a of the high-frequency semiconductor chip 1 via the rectangular slots 10a and 4a, while the high-frequency signal obtained after the processing by the high-frequency semiconductor chip 1 is transmitted from the microstrip line L7b of the high-frequency semiconductor chip 1 to the microstrip line L13b via the rectangular slots 4b and 10b. This obviates the need for the connection by wire bonding, so that the deterioration in the performance of the high-frequency characteristic in the wire bonding portion can be eliminated. Therefore, this arrangement enables the use at a higher frequency.

SECOND PREFERRED EMBODIMENT

Figure 7:
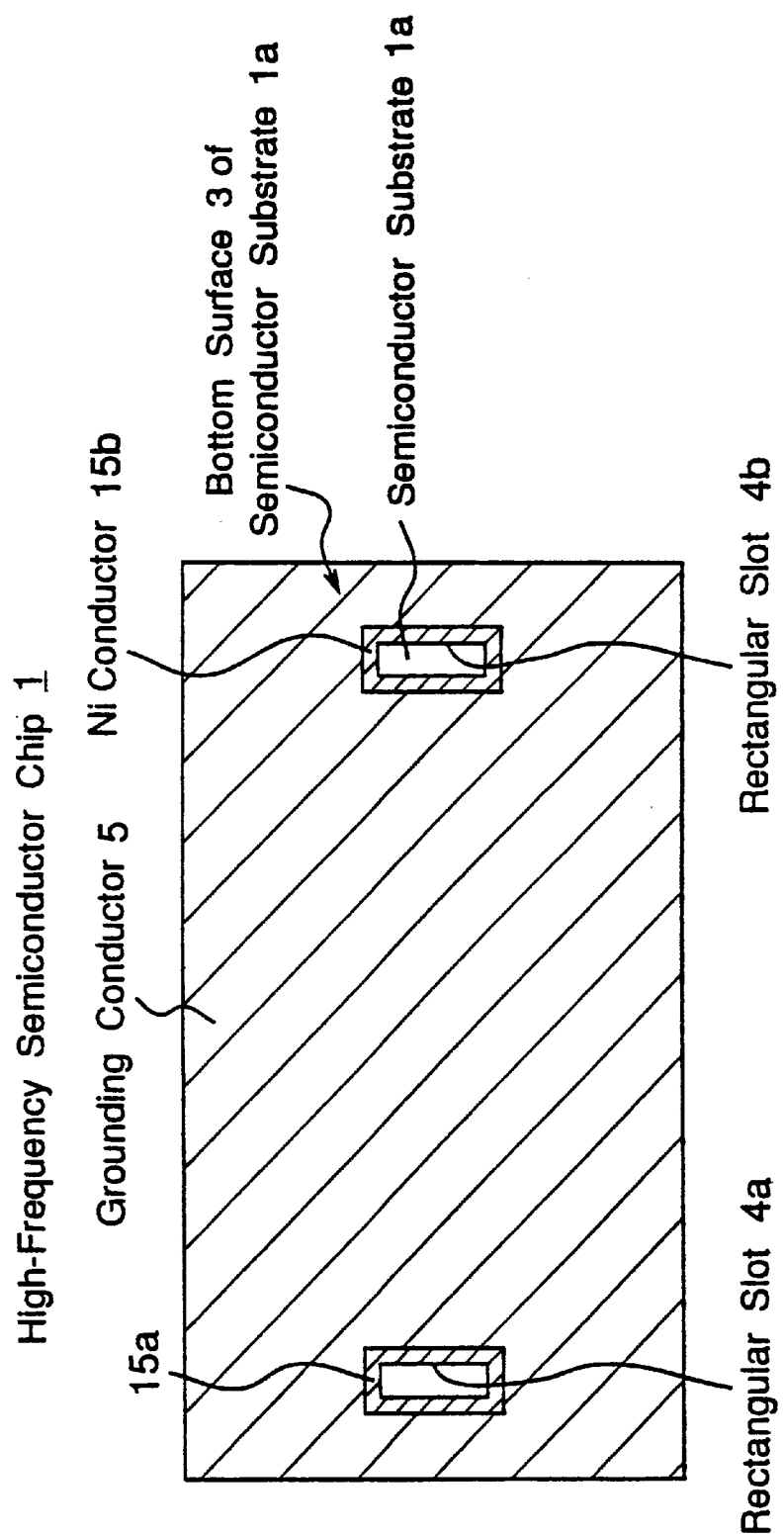
FIG. 7 is a bottom view showing a bottom surface of a high-frequency semiconductor chip 1 according to a second preferred embodiment of the present invention.

FIG. 7 is a bottom view showing a bottom surface of a high-frequency semiconductor chip 1 according to a second preferred embodiment of the present invention. A semiconductor device of the present second preferred embodiment is characterized in that Ni conductors 15a and 15b each having a width of tens micrometers to hundreds micrometers are further formed by a photographic patterning technique onto the grounding conductor 5 located in the vicinity of the rectangular slots 4a and 4b for transmitting the high-frequency signal in the first preferred embodiment. Since Ni tends to be very easily oxidized, the Ni conductors 15a and 15b are hard to become familiar with the solder material. This arrangement can therefore prevent the possible formation a solder bridge over the rectangular slots 4a and 4b due to the scrubbing process upon die-bonding the high-frequency semiconductor chip 1 onto the grounding conductor 9 of the electromagnetic coupling type semiconductor package 8, and this leads to that the deterioration of the frequency characteristic of the high-frequency signal can be prevented.

Although Ni is used for the prevention of the AuSn solder bridge in the second preferred embodiment, it is acceptable to use a metal of Mo, Al or the like.

THIRD PREFERRED EMBODIMENT

Figure 8:
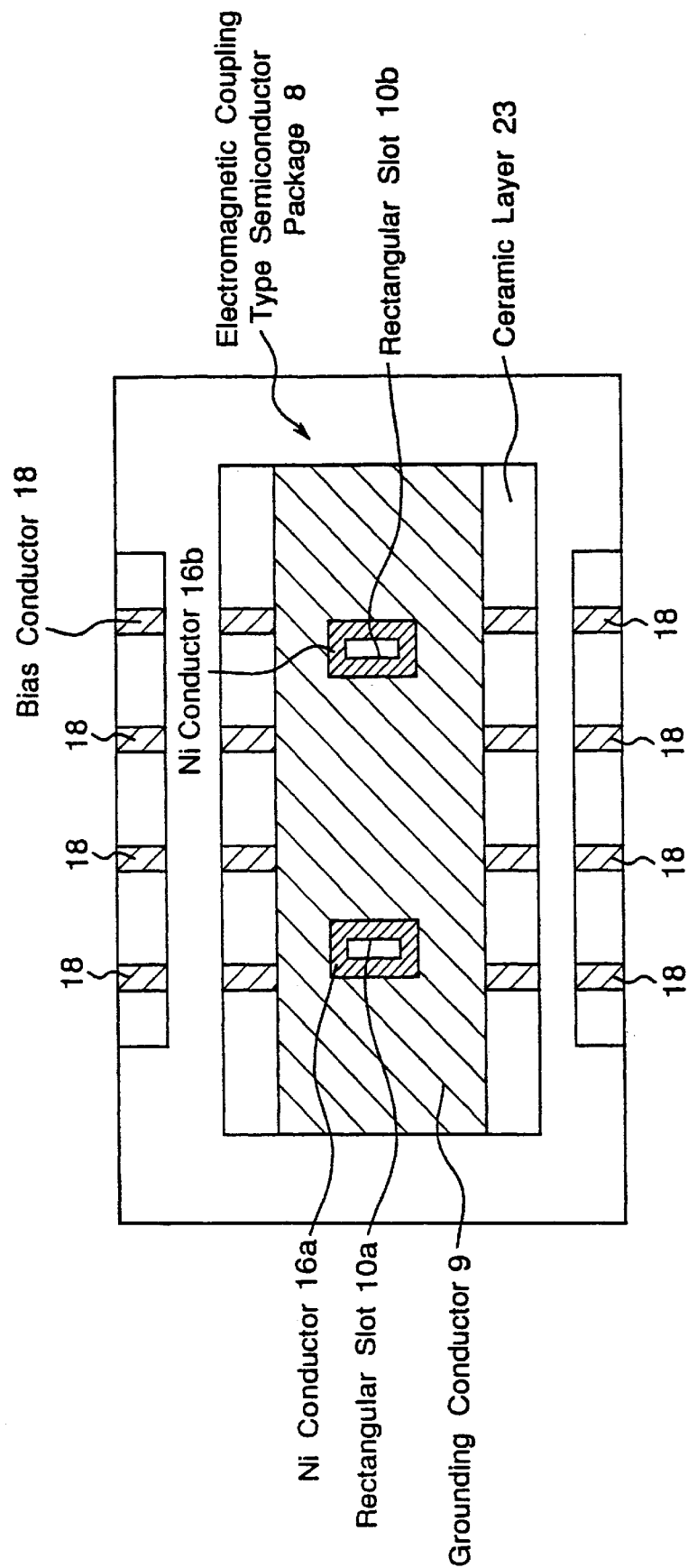
FIG. 8 is a plan view showing a top surface of an electromagnetic coupling type semiconductor package according to a third preferred embodiment of the present invention.

FIG. 8 is a plan view showing a top surface of an electromagnetic coupling type semiconductor package 8 according to a third preferred embodiment of the present invention. A semiconductor device of the present third preferred embodiment is characterized in that Ni conductors 16a and 16b each having a width of tens micrometers to hundreds micrometers are further formed by a photographic patterning technique onto the grounding conductor 9 located in the vicinity of the rectangular slots 10a and 10b for transmitting the high-frequency signal in the first preferred embodiment. Since Ni tends to be very easily oxidized, the Ni conductors 16a and 16b are hard to become familiar with the solder material. This arrangement can therefore prevent the possible formation a solder bridge over the rectangular slots 10a and 10b due to the scrubbing process upon die-bonding the high-frequency semiconductor chip 1 onto the grounding conductor 9 of the electromagnetic coupling type semiconductor package 8, and this leads to that the deterioration of the frequency characteristic of the high-frequency signal can be prevented.

Although Ni is used for the prevention of the AuSn solder bridge in the third preferred embodiment, the present invention is not limited to this, and it is acceptable to use a metal of Mo, Al or the like which tends to be easily oxidized.

FOURTH PREFERRED EMBODIMENT

Figure 9:
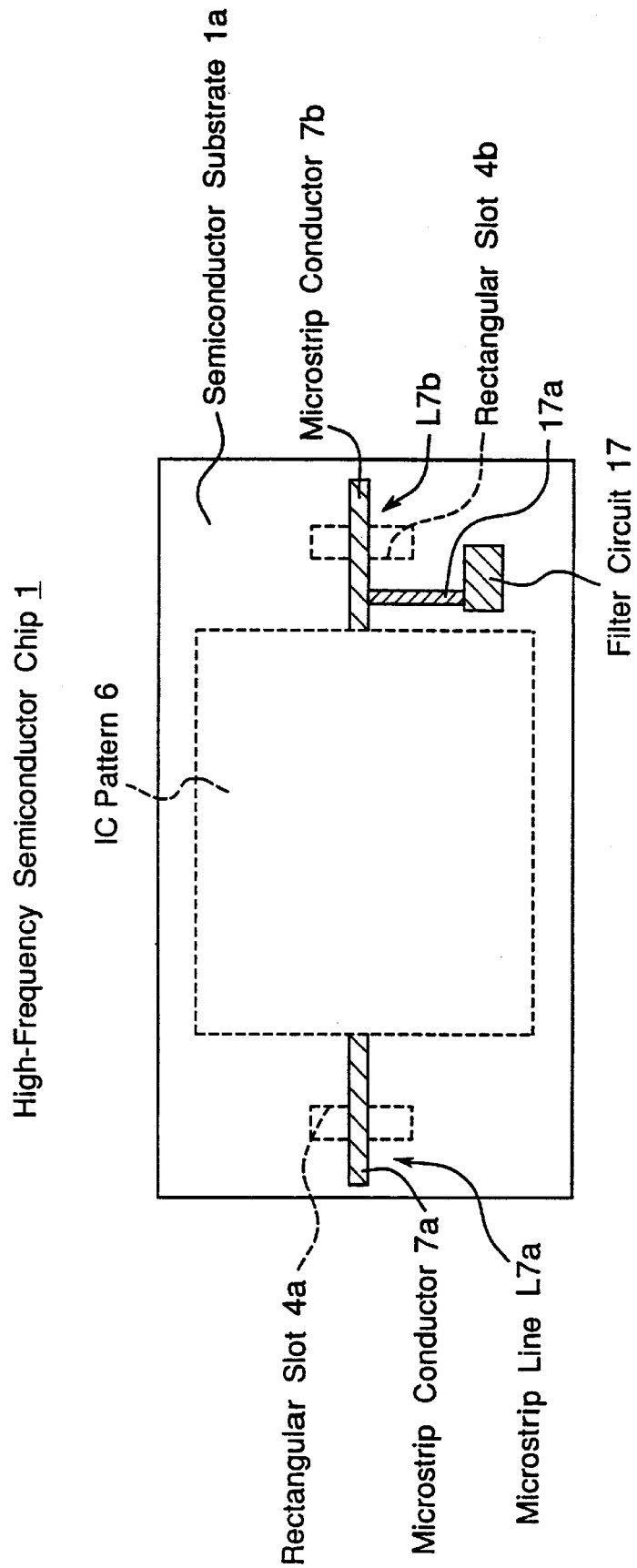
FIG. 9 is a plan view showing a top surface of a high-frequency semiconductor chip according to a fourth preferred embodiment of the present invention.

FIG. 9 is a plan view showing a top surface of a high-frequency semiconductor chip 1 according to a fourth preferred embodiment of the present invention.

Referring to FIG. 9, the high-frequency semiconductor chip 1 of present fourth preferred embodiment is characterized in that a filter circuit 17 provided with a low-pass filter for allowing the passing of the frequency components other than the transmission band of the high-frequency signal by the electromagnetic coupling system and, in particular, the low-frequency component for the achievement of grounding is connected to the microstrip conductor 7b of the microstrip line L7b for outputting a high-frequency signal. The filter circuit 17 is constructed by being led out by way of, for example, a microstrip conductor 17a having a length of a quarter wavelength of the desired frequency to be low-pass filtered from the microstrip conductor 7b, namely, by forming the microstrip conductor 17a so as to be connected to the microstrip conductor 7b, and then connecting an end portion of the microstrip conductor 17a to the grounding conductor 5 (See FIG. 1) via a parallel circuit made of a capacitor and a resistor. Otherwise, the filter circuit 17 may be constructed by being led out by way of, for example, a microstrip conductor 17a having a length of a quarter wavelength of the desired frequency to be low-pass filtered from the microstrip conductor 7b, namely, by forming the microstrip conductor 17a so as to be connected to the microstrip conductor 7b, and then connecting a radial stub to an end portion of the microstrip conductor 17a via a resistor. The patterning of the microstrip conductor 17a and the filter circuit 17 can be performed by the normal IC fabricating technique.

As described above, by providing the output line section of the high-frequency signal with the filter circuit 17 for allowing the passing of the frequency components other than the transmission band of the high-frequency signal by the electromagnetic coupling system and, in particular, the low-frequency component, and then making the filter circuit 17 absorb the frequency components other than the transmission band of the high-frequency signal, the parasitic oscillation caused by the feedback of the frequency components other than the transmission band of the high-frequency signal by the electromagnetic coupling system to the side of the high-frequency semiconductor chip 1 as a consequence of the total reflection of the frequency components can be prevented.

Although the filter circuit 17 is provided on the microstrip line L7b on the output side of the high-frequency signal in the above-mentioned fourth preferred embodiment, the present invention is not limited to this, and the filter circuit 17 may be provided onto the microstrip line L7a on the input side of the high-frequency signal.

FIFTH PREFERRED EMBODIMENT

Figure 10:
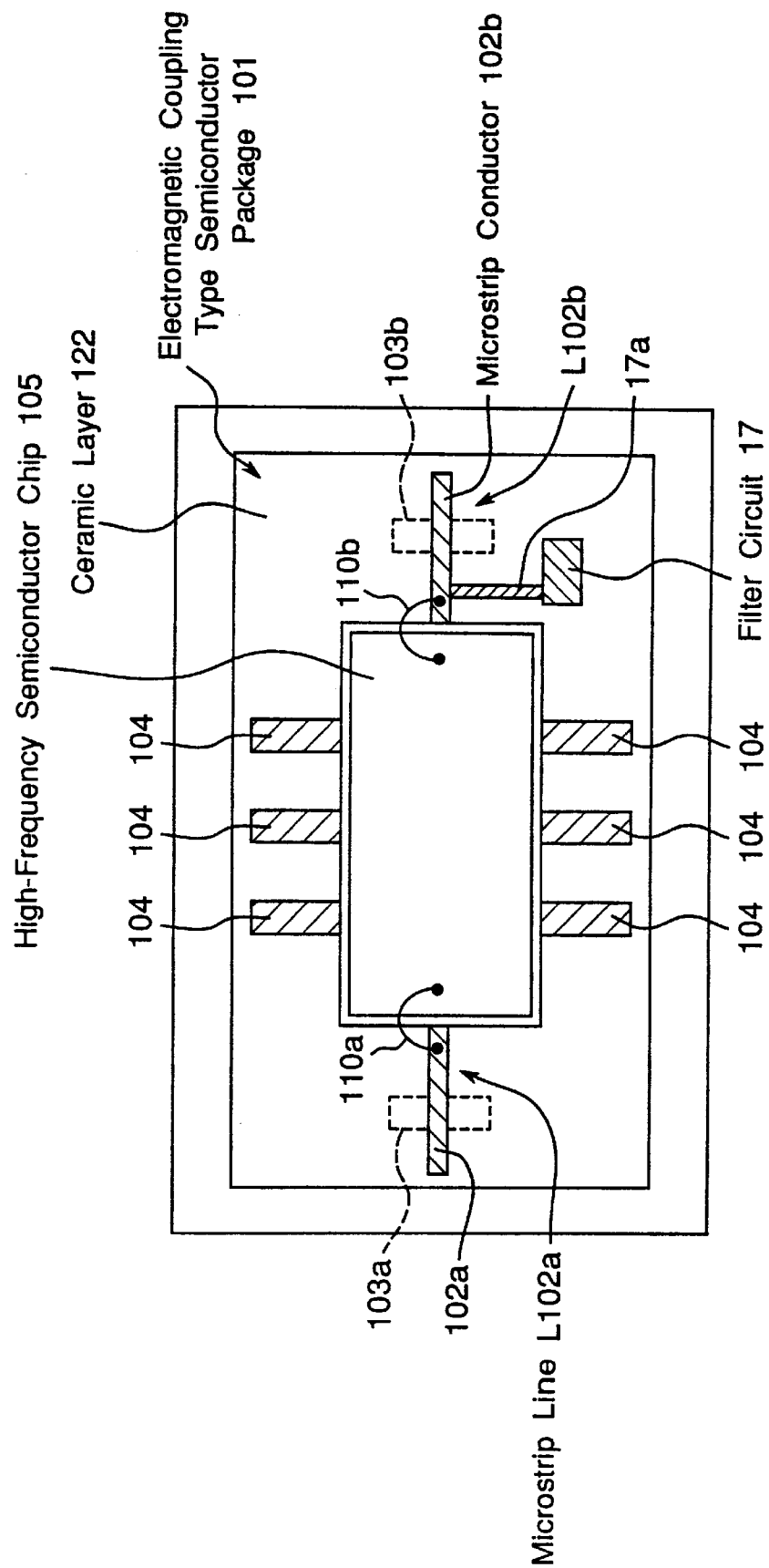
FIG. 10 is a plan view showing a top surface of an electromagnetic coupling type semiconductor package according to a fifth preferred embodiment of the present invention.

FIG. 10 is a plan view showing a top surface of an electromagnetic coupling type semiconductor package 101 according to a fifth preferred embodiment of the present invention. In contrast to the prior art shown in FIG. 13, the electromagnetic coupling type semiconductor package 101 of the present fifth preferred embodiment as shown in FIG. 10 is characterized in that a filter circuit 17 provided with a low-pass filter for allowing the passing of the frequency components other than the transmission band of the high-frequency signal by the electromagnetic coupling system and, in particular, the low-frequency component for the achievement of grounding is connected to a microstrip conductor 102b of the microstrip line L102b for outputting a high-frequency signal. The present filter circuit 17 is constructed by being led out by way of, for example, a microstrip conductor 17a having a length of a quarter wavelength of the desired frequency to be low-pass filtered from the microstrip conductor 102b, namely, by forming the microstrip conductor 17a so as to be connected to the microstrip conductor 102b, and then grounding an end portion of the microstrip conductor 17a to a grounding conductor 108 (See FIG. 12) via a parallel circuit of a capacitor and a resistor. Otherwise, the filter circuit 17 may be constructed by being led out by way of, for example, a microstrip conductor 17a having a length of a quarter wavelength of the desired frequency to be low-pass filtered from the microstrip conductor 102b, namely, by forming the microstrip conductor 17a so as to be connected to the microstrip conductor 102b, and then, connecting a radial stub to an end portion of the microstrip conductor 17a via a resistor. The formation of the conductor and stub in the microstrip conductor 17a and the filter circuit 17 can be achieved by a conventional package manufacturing technique, practically by manufacturing the patterns of capacitors, resistors and so on by a thin film forming technique and subsequently incorporating them to the electromagnetic coupling type semiconductor package 101.

As described above, by providing the output line section of the high-frequency signal with the filter circuit 17 for allowing the passing of the frequency components other than the transmission band of the high-frequency signal by the electromagnetic coupling system and, in particular, the low-frequency component, and then making the filter circuit 17 absorb the frequency components other than the transmission band of the high-frequency signal, and this leads to that the parasitic oscillation caused by the feedback of the frequency components other than the transmission band of the high-frequency signal by the electromagnetic coupling system to the side of the high-frequency semiconductor chip 1 as a consequence of the total reflection of the frequency components can be prevented.

Although the filter circuit 17 is provided on the microstrip line L102b on the output side of the high-frequency signal in the above-mentioned fifth preferred embodiment, the present invention is not limited to this, and the filter circuit 17 may be provided on the microstrip line L102a on the input side of the high-frequency signal.

Figure 11:
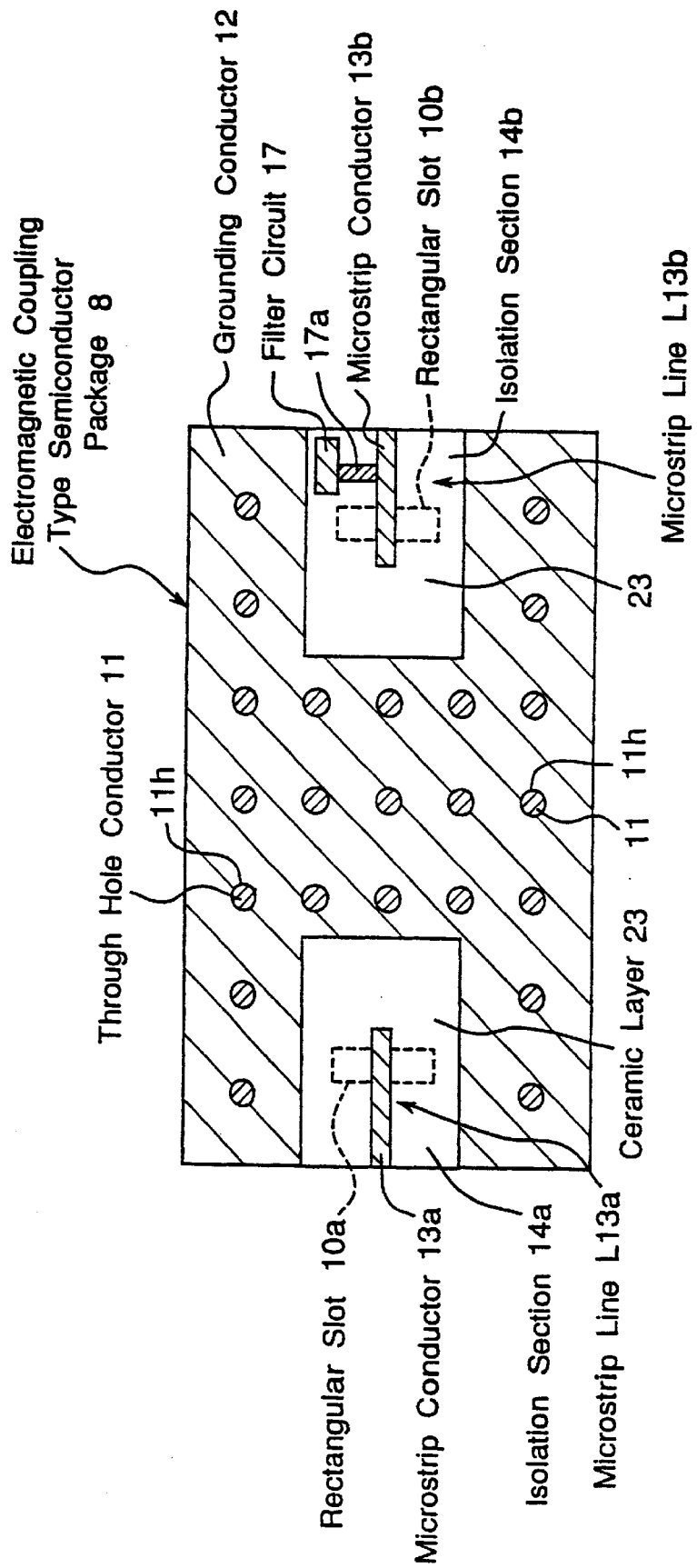
FIG. 11 is a bottom view showing a bottom surface of an electromagnetic coupling type semiconductor package according to a modified preferred embodiment of the present invention.
Figure 13:
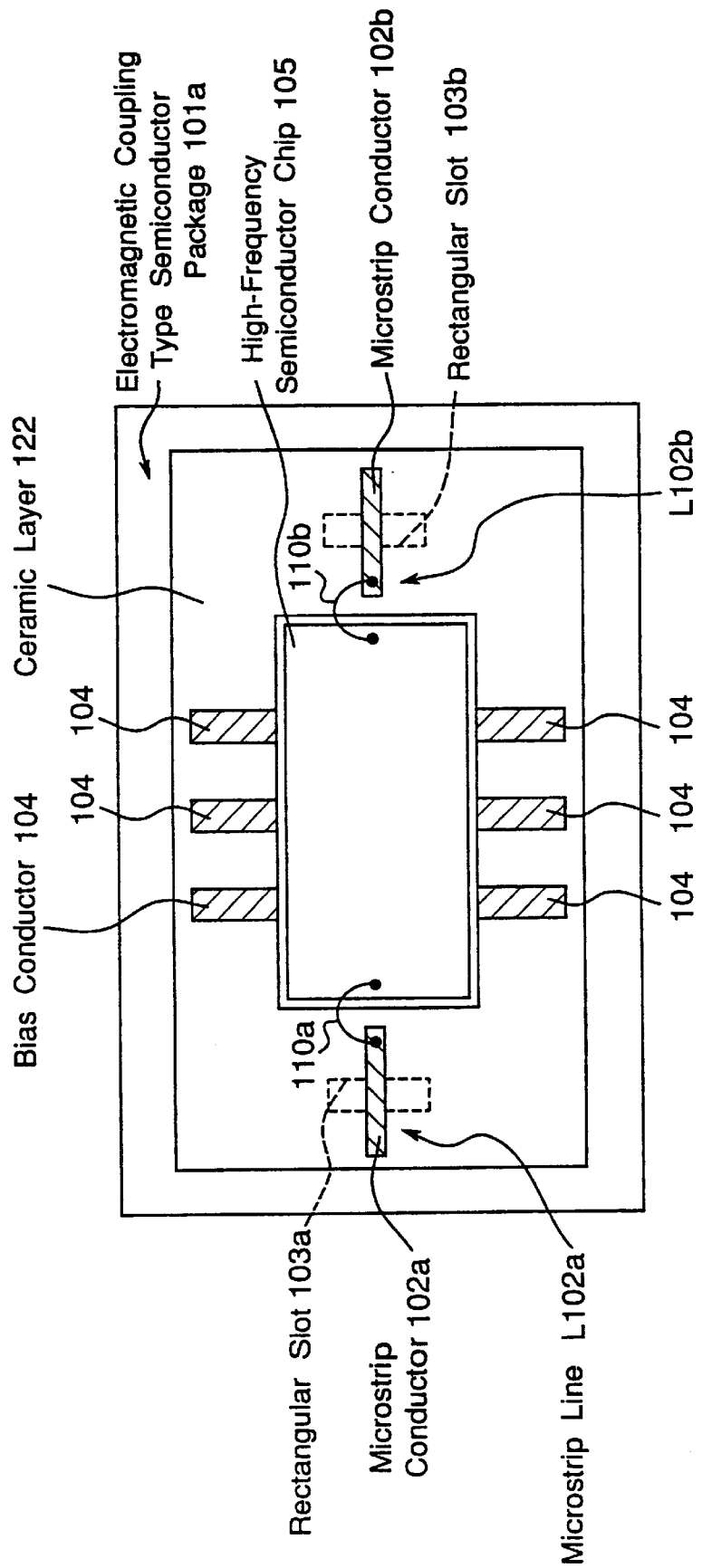
FIG. 13 is a plan view showing a top surface of the electromagnetic coupling type semiconductor package shown in FIG. 12.
Figure 14:
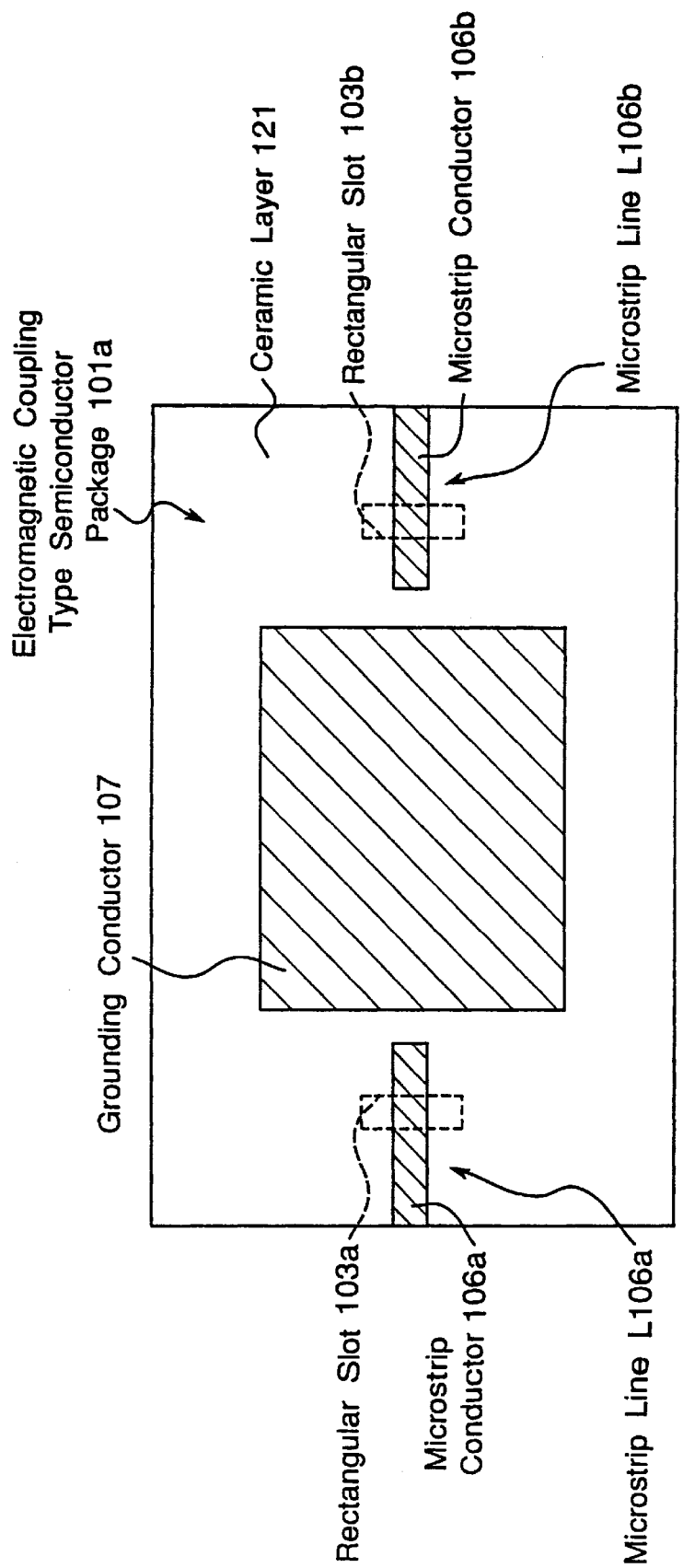
FIG. 14 is a bottom view showing a bottom surface of the electromagnetic coupling type semiconductor package shown in FIG. 12.
Figure 15:
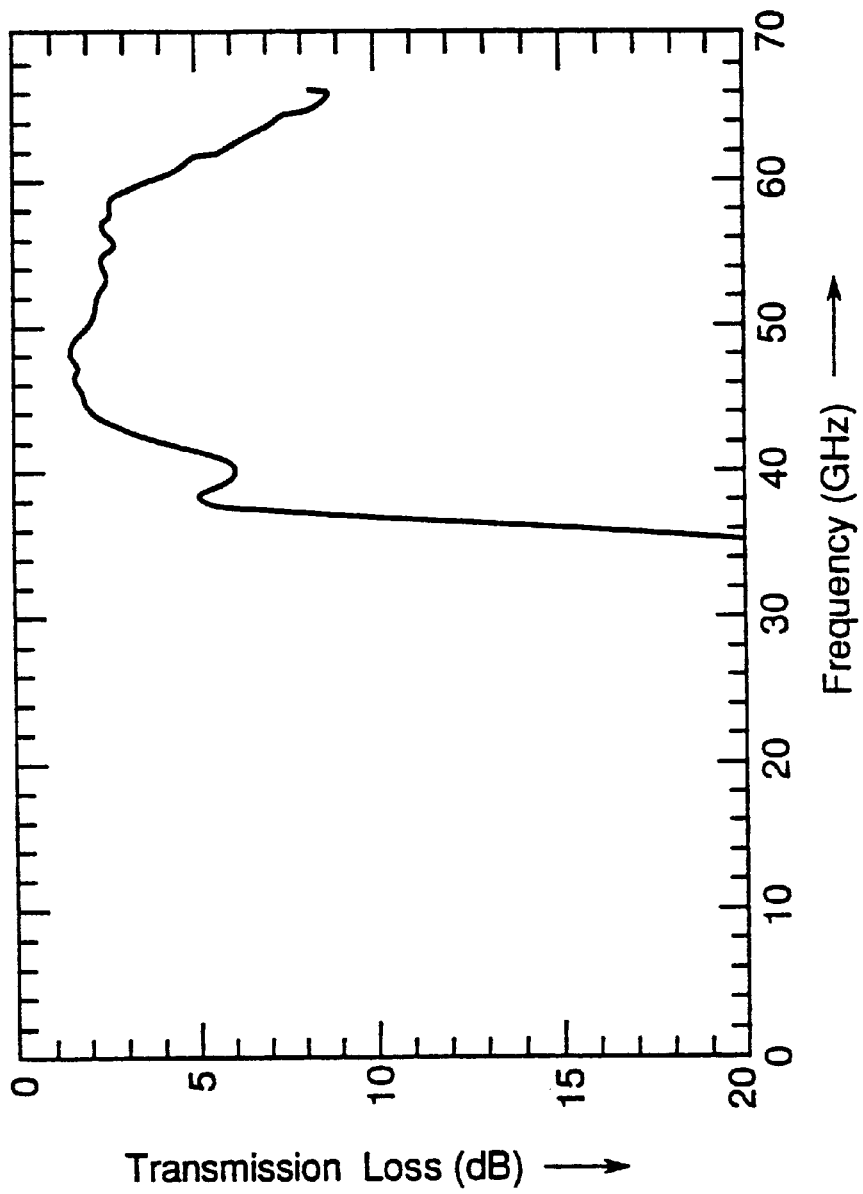
FIG. 15 is a graph showing a high-frequency transmission characteristic of the semiconductor device shown in FIG. 12.

The filter circuit 17 is connected to the microstrip line L102b of the prior art electromagnetic coupling type semiconductor package 101 shown in FIG. 13 in the above-mentioned fifth preferred embodiment. However, the present invention is not limited to this, and as shown in a modified preferred embodiment shown in FIG. 11, the filter circuit 17 may be connected via the microstrip conductor 17a to the microstrip line L13b on the output side formed in the isolation section 14b of the electromagnetic coupling type semiconductor package 8 of the first preferred embodiment shown in FIG. 6. Otherwise, the filter circuit 17 may be connected via the microstrip conductor 17a to the microstrip line L13a on the input side formed in the isolation section 14a of the electromagnetic coupling type semiconductor package 8 of the modified preferred embodiment shown in FIG. 11.

According to the present invention, for example, the high-frequency signal inputted to the second high-frequency inputting and outputting transmission line is inputted to the first high-frequency inputting and outputting transmission line via the second slot and the first slot and thereafter, the high-frequency signal is inputted to the high-frequency semiconductor chip. This obviates the need for the connection by wire bonding as in the prior art, so that the deterioration in performance of the high-frequency characteristics in the wire bonding portion can be eliminated. Therefore, this arrangement enables the use at a higher frequency.

Furthermore, the Ni conductor is formed on the first grounding conductor located in the peripheral portion of the first slot in the above-mentioned semiconductor device. This arrangement can therefore prevent the possible formation of a solder bridge over the first rectangular slot due to the scrubbing process upon die-bonding the high-frequency semiconductor chip onto the second grounding conductor of the semiconductor package, and this leads to that the deterioration of the frequency characteristic of the high-frequency signal can be prevented.

Furthermore, in the above-mentioned semiconductor device, the Ni conductor is formed on the second grounding conductor located in the peripheral portion of the second slot. This arrangement can therefore prevent the possible formation of a solder bridge over the second rectangular slot due to the scrubbing process upon die-bonding the high-frequency semiconductor chip onto the second grounding conductor of the semiconductor package, and this leads to that the deterioration of the frequency characteristic of the high-frequency signal can be prevented.

In the above-mentioned semiconductor device, the filter circuit for removing the frequency components other than the frequency component transmitting via the high-frequency semiconductor chip is further connected to the first high-frequency inputting and outputting transmission line. Therefore, by providing, for example, the high-frequency inputting and outputting transmission line on the output side with the filter circuit for allowing the passing of the frequency components other than the transmission band of the high-frequency signal by the electromagnetic coupling system and making the filter circuit absorb the frequency components other than the transmission band of the high-frequency signal, the parasitic oscillation caused by the feedback of the frequency components other than the transmission band of the high-frequency signal by the electromagnetic coupling system to the side of the high-frequency semiconductor chip as a consequence of the total reflection of the frequency components can be prevented.

Furthermore, in the above-mentioned semiconductor device, the filter circuit for removing the frequency components other than the frequency component transmitting via the high-frequency semiconductor chip is further connected to the second high-frequency inputting and outputting transmission line. Therefore, by providing, for example, the high-frequency inputting and outputting transmission line on the output side with the filter circuit for allowing the passing of the frequency components other than the transmission band of the high-frequency signal by the electromagnetic coupling system, and then making the filter circuit absorb the frequency components other than the transmission band of the high-frequency signal, the parasitic oscillation caused by the feedback of the frequency components other than the transmission band of the high-frequency signal by the electromagnetic coupling system to the side of the high-frequency semiconductor chip as a consequence of the total reflection of the frequency components can be prevented.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device comprising:
   a high-frequency semiconductor chip having first and second surfaces, and including a first high-frequency transmission line on said first surface and a first grounding conductor on said second surface; and
   a semiconductor package having third and fourth surfaces, and including a second grounding conductor on said third surface and a second high-frequency transmission line on said fourth surface, wherein said high-frequency semiconductor chip is mounted on said semiconductor package so that said second surface opposes said third surface, said semiconductor chip and said semiconductor package respectively including first and second slots for electromagnetically coupling said first high-frequency transmission line to said second high-frequency transmission line, said first and second slots being located in said first and second grounding conductors, respectively, opposite each other and opposite said first and second high-frequency transmission lines.

2. The semiconductor device as claimed in claim 1, further comprising an Ni conductor on said first grounding conductor, at a peripheral portion of said first slot.

3. The semiconductor device as claimed in claim 1, further comprising an Ni conductor on said second grounding conductor, at a peripheral portion of said second slot.

4. The semiconductor device as claimed in claim 2, further comprising an Ni conductor on said second grounding conductor, at a peripheral portion of said second slot.

5. The semiconductor device as claimed in claim 1, comprising a filter circuit for removing frequency components other than a frequency component transmitted via said high-frequency semiconductor chip, said filter circuit being connected to said first high-frequency transmission line.

6. The semiconductor device as claimed in claim 2, comprising a filter circuit for removing frequency components other than a frequency component transmitted via said high-frequency semiconductor chip, said filter circuit being connected to said first high-frequency transmission line.

7. The semiconductor device as claimed in claim 3, comprising a filter circuit for removing frequency components other than a frequency component transmitted via said high-frequency semiconductor chip, said filter circuit being connected to said first high-frequency transmission line.

8. The semiconductor device as claimed in claim 4, comprising a filter circuit for removing frequency components other than a frequency component transmitted via said high-frequency semiconductor chip, said filter circuit being connected to said first high-frequency inputting and outputting transmission line.

9. The semiconductor device as claimed in claim 1, comprising a further filter circuit for removing frequency components other than a frequency component transmitted via said high-frequency semiconductor chip, said further filter circuit being connected to said second high-frequency transmission line.

10. The semiconductor device as claimed in claim 2, comprising a further filter circuit for removing frequency components other than a frequency component transmitted via said high-frequency semiconductor chip, said further filter circuit being connected to said second high-frequency transmission line.

11. The semiconductor device as claimed in claim 3, comprising a further filter circuit for removing frequency components other than a frequency component transmitted via said high-frequency semiconductor chip, said further filter circuit being connected to said second high-frequency transmission line.

12. The semiconductor device as claimed in claim 4, comprising a further filter circuit for removing frequency components other than a frequency component transmitted via said high-frequency semiconductor chip, said further filter circuit being connected to said second high-frequency transmission line.

13. The semiconductor device as claimed in claim 5, comprising a further filter circuit for removing frequency components other than a frequency component transmitted via said high-frequency semiconductor chip, said further filter circuit being connected to said second high-frequency transmission line.

14. The semiconductor device as claimed in claim 6, comprising a further filter circuit for removing frequency components other than a frequency component transmitting via said high-frequency semiconductor chip, said further filter circuit being connected to said second high-frequency transmission line.

15. The semiconductor device as claimed in claim 7, comprising a further filter circuit for removing frequency components other than a frequency component transmitted via said high-frequency semiconductor chip, said further filter circuit being connected to said second high-frequency transmission line.

16. The semiconductor device as claimed in claim 8, comprising a further filter circuit for removing frequency components other than a frequency component transmitted via said high-frequency semiconductor chip, said further filter circuit being connected to said second high-frequency transmission line.

17. The semiconductor device as claimed in claim 1, wherein said first grounding conductor contacts said second grounding conductor whereby the first and second slots electromagnetically couple said first high-frequency transmission line to said second high-frequency transmission line through said high-frequency semiconductor chip from said first surface to said second surface and through said semiconductor package from said third surface to said fourth surface.

* * * * *

UNITED STATES PATENT AND TRADEMARK OFFICE
CERTIFICATE OF CORRECTION

PATENT NO. : 5,977,631
DATED : November 2, 1999
INVENTOR(S) : Yoshihiro Notani

It is certified that error appears in the above-identified patent and that said Letters Patent is hereby corrected as shown below:

Title page, item [30], should read --
Jan. 1, 1998

Signed and Sealed this

First Day of May, 2001

Attest:

NICHOLAS P. GODICI

Attesting Officer     Acting Director of the United States Patent and Trademark Office

UNITED STATES PATENT AND TRADEMARK OFFICE
CERTIFICATE OF CORRECTION

PATENT NO.     : 5,977,631
DATED          : November 2, 1999
INVENTOR(S)    : Yoshihiro Notani It is certified that error appears in the above-identified patent and that said Letters Patent is hereby corrected as shown below:

<u>Title page,</u>
Item [30], should read -- Jan. 6, 1998 --

This certificate supersedes Certificate of Correction issued May 1, 2001.

Signed and Sealed this

Third Day of September, 2002

*Attest:*

*Attesting Officer*

JAMES E. ROGAN
*Director of the United States Patent and Trademark Office*